United States Patent
Belmans (10) Patent No.: US 10,176,278 B2
(45) Date of Patent: Jan. 8, 2019

(54) SIMULATION OF THE PHYSICAL BEHAVIOR OF AN OBJECT IN A 3D SCENE DIVIDED INTO A PLURALITY OF ZONES

(71) Applicant: Dassault Systemes, Velizy Villacoublay (FR)

(72) Inventor: Philippe Belmans, Paris (FR)

(73) Assignee: Dassault Systemes, Velizy Villacoublay (FR)

( * ) Notice: Subject to any disclaimer, the term of this patent is extended or adjusted under 35 U.S.C. 154(b) by 773 days.

(21) Appl. No.: 14/108,116

(22) Filed: Dec. 16, 2013

(65) Prior Publication Data

US 2014/0180653 A1 Jun. 26, 2014

(30) Foreign Application Priority Data

Dec. 21, 2012 (EP) .................................... 12306653

(51) Int. Cl.
*A63F 13/30* (2014.01)
*G06F 17/50* (2006.01)
*A63F 13/352* (2014.01)
*A63F 13/69* (2014.01)

(52) U.S. Cl.
CPC .......... *G06F 17/5009* (2013.01); *A63F 13/12* (2013.01); *A63F 13/352* (2014.09); *A63F 13/69* (2014.09); *A63F 2300/531* (2013.01); *A63F 2300/534* (2013.01); *A63F 2300/5533* (2013.01)

(58) Field of Classification Search
None
See application file for complete search history.

(56) References Cited

U.S. PATENT DOCUMENTS

| 7,803,054 B1* | 9/2010 | Ogus | A63F 13/12 463/31 |
|---|---|---|---|
| 8,678,929 B1* | 3/2014 | Nishimura | A63F 13/10 463/31 |
| 2003/0177187 A1* | 9/2003 | Levine | A63F 13/10 709/205 |
| 2006/0258462 A1* | 11/2006 | Cheng | G07F 17/32 463/42 |
| 2007/0094325 A1* | 4/2007 | Ih | A63F 13/12 709/203 |

(Continued)

FOREIGN PATENT DOCUMENTS

CN 1848124 A 10/2006

OTHER PUBLICATIONS

J. Huang, Y. Du, C. Wang, "Design of the Server Cluster to Support Avatar Migration" 8 pages, IEEE 2003.*
J. Huang, Y. C. Du, C. Wang, "Design of the Server Cluster to Support Avatar Migration" 8 pages, IEEE 2003.*
James Beardsley, "Massively Multiplayer Game Development—Chapter 3.1 Seamless Servers," In: "Massively Multiplayer Game Development—Chapter 3.1 Seam less Servers," Dec. 31, 2003 (Dec. 31, 20013), Charles River Media, Inc. XP055061838.
European Search Report for European Application No. 12 30 6653, dated May 6, 2013.

(Continued)

*Primary Examiner* — Kibrom K Gebresilassie
(74) *Attorney, Agent, or Firm* — Hamilton, Brook, Smith & Reynolds, P.C.

(57) ABSTRACT

Embodiments of the present invention provide functionality simulating the physical behavior of at least one object in a three dimensional (3D) scene that is divided into a plurality of zones. One such example embodiment comprises: providing at least a first zone and a second zone topologically adjacent, each zone having its own computing resource, providing an object located in one or both zones, and simulating the physical behavior of the object, the simulation being performed by the computing resource of each one of said first and second zones.

12 Claims, 5 Drawing Sheets

(56) References Cited

U.S. PATENT DOCUMENTS

| | | | | |
|---|---|---|---|---|
| 2009/0259946 A1* | 10/2009 | Dawson | .................. | G06Q 30/02 |
| | | | | 715/747 |
| 2010/0113159 A1* | 5/2010 | Chapman | .................. | A63F 3/04 |
| | | | | 463/42 |
| 2010/0273418 A1* | 10/2010 | Eruchimovitch | ..... | G01S 5/0221 |
| | | | | 455/41.2 |
| 2010/0304804 A1* | 12/2010 | Spivack | .................. | G06N 3/006 |
| | | | | 463/2 |
| 2013/0179855 A1* | 7/2013 | Elliott | .................. | G06F 17/5009 |
| | | | | 716/139 |
| 2013/0249948 A1* | 9/2013 | Reitan | .................... | G06F 3/011 |
| | | | | 345/633 |
| 2013/0252725 A1* | 9/2013 | Buhr | ........................ | A63F 13/10 |
| | | | | 463/29 |
| 2013/0321403 A1* | 12/2013 | Piemonte | ................ | G06T 15/00 |
| | | | | 345/419 |
| 2016/0300387 A1* | 10/2016 | Ziman | .................. | G06T 19/003 |

OTHER PUBLICATIONS

Search Report for CN Application No. 201310757159.3 dated May 15, 2017, entitled "Simulation of the Physical Behavior of an Object in a 3D Scene Divided into a Plurality of Zones".

Ebara et al., "Dynamic region decomposition method in large-scale virtual space," CD-ROM of IPSJ SIG Technical Report Fiscal Jan. 2012, pp. 1-8, Information Processing Society of Japan, Japan, Jun. 15, 2012.

Endo et al., "Load distribution technique for high density of user in MMO Virtual Environment," IPSJ SIG Technical Report, vol. 2008, No. 21, pp. 213-218, Information Processing Society of Japan, Japan, Mar. 6, 2008.

* cited by examiner

SIMULATION OF THE PHYSICAL BEHAVIOR OF AN OBJECT IN A 3D SCENE DIVIDED INTO A PLURALITY OF ZONES

RELATED APPLICATION(S)

This application claims priority under 35 U.S.C. § 119 or 365 to European, Application No. 12306653.2, filed Dec. 21, 2012.

The entire teachings of the above application(s) are incorporated herein by reference.

FIELD OF THE INVENTION

The invention relates to the field of computer programs and systems, and more specifically to a method, system and program for simulating the physical behavior of at least one object in a 3D scene divided into a plurality of zones.

BACKGROUND OF THE INVENTION

Massively Multi-user On line applications (MMOs) allow a large number of users to simultaneously use an application such as real-world phenomena simulator, immersive applications, and so on. Similarly, Massively Multi-user On line Games (MMOG) allow a large number of gamers to play simultaneously a video game. MMOs and MMOGs notably rely on computer networks, e.g. the Internet, for allowing the users or gamers to connect to the applications or video games. Throughout this specification the word "application" and "video games" will be understood as to be synonymous, and the terms MMO and MMOG will be indifferently used.

MMO involve a complex and large virtual environments which is desired to be rendered in as much detail as possible, in as close to real time as possible, in order to provide users or game players with a more realistic experience. MMOs are specifically designed for the representation and the manipulation of 3D scenes, and are typically utilized on the end-user's computer for applications that require interactive, sequential, real-time 3D scene generation. As the user interacts with the 3D scene, the computer redraws the 3D representation rapidly enough to convey to the user the sense of a continuous, ongoing reality in which the user is participating. The scene is composed of many separate objects that can be manipulated by user when interacting with the 3D scene. Thus, MMOs involve large data volumes, high data rates and high data complexity is generally required in order to manage large numbers of users participating in real time in a spatially complex and highly detailed virtual environment.

MMOs are typically used for simulating real-world phenomena within computer models; for instance Multi-Body Rigid Dynamics, Human Simulation, Cloth Simulation, Particle Simulation. Simulations require accurate data and algorithms that describe real-world phenomena, such as the physical properties (strength, elasticity, etc.) of the materials used in a manufacturing process and the product to create a simulation of the process and a simulation of a product in use. 3D CAD/CAM (Computer Aided Design, Computer Aided Manufacturing) tools allow to create 3D representations of the product or component parts.

The main and critical requirement of MMOs and MMOGs is to offer a real-time response at anytime to the connected players, regardless of their number, and regardless of the induced computation costs for solving and rendering of the application. Otherwise, the quality of play experience turns poor, decreasing players' interest for the application, limiting interaction when performing collaborative and distributed design review.

MMO's, just like MMOG's, must be scalable to dynamically adapt to the perpetually changing work-load, maintaining thus real-time performance. Scalability notably comprises the number of users that can simultaneously use the application, the number of computing resources for computing the simulations, the number of simultaneous interactions between objects of the 3D scene allowed by the application, and so on. For MMOG's, the number of users may vary significantly, as well as the positional and graphical attributes of all contained dynamic objects. Nevertheless, the surrounding scenery is set once for all and the typology of dynamic objects and the supported behavior classes are predefined, before the game starts. Said otherwise, 3D scenes in MMOGs comprise a number of predetermined characteristics that strongly limit the needs of computing resources; thus improving scalability.

On the contrary, for advanced MMOs, the scenery and population typology of the 3D scene can evolve and enrich, especially while application is running. Indeed, MMOs aim at real-world phenomena, wherein the behaviour of objects is dynamic and excludes predefined behavior classes. Consequently, 3D scenery in MMOs cannot use predefined characteristics as for MMOGs.

The issue of scalability is addressed by MMOG. Such solutions and techniques include Sharding and Zoning. Sharding consists in cloning the world (partially or entirely) and host newly logged users to cope with the workload rise, but with no possible interaction between shards. So by nature, Sharding cannot support unlimited expansion of the virtual world space and population: shards have indeed a physical capacity ceiling dictated by the performance of their assigned processing resources.

Zoning relies on a partition of the virtual world space in so called zones, each of them under the responsibility of a computing resource. Objects/users can navigate from zone to zone. Associated computing resources communicate then dedicated messages on a network to integrate these moving objects in their computational models.

However, in MMOGs, zones evolve quite independently from one another: dynamic objects are simply "teleported" from one of few predefined passage locations of zone "A" to another of few of zone "B". The issue of optimal load balancing is solved by fencing zones with obstacles or solid walls, by limiting the number of inter-zone passage locations, by limiting the population of objects within each zone at anytime, and by filling the zones with adjusted static décor. In a way, the different regions of the virtual environment are customized to fit the real-time requirements.

However, for advanced physics simulations in MMO's, these simplifications are not acceptable. Indeed, a virtual environment, especially when real-world phenomena are simulated, cannot support an artificial fencing of the scenery which limits possibilities of customizations of the simulated real-world. Especially, all objects should be able to cross border between two or several Zones at any point, and the crossing has to be performed keeping state continuity of the objects (e.g. positions and velocities). Moreover, neighbor Zones usually have mutual interactions through objects they share in their common frontiers (e.g. contact forces) and thus mechanisms such as "teleportation" are inefficient for a realistic simulation. Besides, simulation of common physical behavior require a continuous and repetitive communication between Zones of data according to the considered discipline of Physics, which may be quite complex.

Within this context, there is still a need for an improved method, computer program, and system providing a scalable, seamless, and effective real-time simulation of the physical behavior of an object in a 3D scene divided into a plurality of zones.

SUMMARY OF THE INVENTION

According to one aspect, the invention therefore provides a computer-implemented method for simulating the physical behavior of at least one object in a 3D scene divided into a plurality of zones. The method comprises:

providing at least a first zone and a second zone topologically adjacent, each zone having its own computing resource;

providing an object located in one or both zones; and simulating the physical behavior of the object, the simulation being performed by the computing resource of each one of said first and second zones.

The method may comprise one or more of the following:

at step of providing an object, an instance of the object is computed for each zone wherein the object is located, the computed instances of the object being identical; and the step of simulating the physical behavior of the object is performed according to a physical state linked with the instance of the object;

after the step of providing, a step of exchanging information between the first zone and the second zone, the exchanged information including at least the physical state of the object in one zone and the presence or the absence of the object in the other zone;

after the step of providing, the steps of determining that the object is located on both zones; computing, by one of both zones that is the arrival zone of the object, the presence of the object in the other zone that is the departure zone of the object by checking that the object is not fully in the arrival zone; exchanging, from the arrival zone to the departure zone, information indicating the presence of the object in the departure zone;

after the step of providing, the steps of determining that the object is no more located in one of the zones; computing by one of the zones that is the arrival zone of the object, the absence of the object in the other zone that is the departure zone of the object by checking that the object is fully in the arrival zone; exchanging, from the arrival zone to the departure zone, information indicating the absence of object in the departure zone; and killing by the departure zone the instance of the object in the departure zone;

after the step of providing, the steps of determining that the object is entering in one of the zone that is the arrival zone of the object; computing by the other zone that is the departure zone, the presence of the object in the arrival zone by checking that the object is not fully in the departure zone; exchanging, from the departure zone to the arrival zone, information indicating the presence of the object in the arrival zone; and creating by the arrival zone an instance of the object;

the step of exchanging information between the first zone and the second zone is performed through a synchronous communication channel between the first and the second zones;

the step of exchanging information between the first zone and the second zone is performed through an asynchronous communication channel between the first and the second zones;

the step of exchanging information between the first zone and the second zone is performed with a reliable communication channel between the first and the second zones;

the step of exchanging information between the first zone and the second zone is performed with an unreliable communication channel between the first and the second zones;

the unreliable communication channel uses the user datagram protocol.

The invention further proposes a computer program comprising instructions computer program comprising instructions for execution by a computer, the instructions being adapted for performing the steps of the method of the invention.

The invention further proposes a computer readable storage medium having recorded thereon the above computer program.

The invention further proposes a computerized system comprising a storage system for storing at least a first zone and a second zone topologically adjacent of a three-dimensional scene divided into a plurality of zones and for storing an object in one or both zones; a processing unit for simulating the physical behavior of the object according to the method of the invention.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

Embodiments of the invention will now be described, by way of non-limiting example, and in reference to the accompanying drawings, where.

DETAILED DESCRIPTION OF THE INVENTION

A description of example embodiments of the invention follows.

The teachings of all patents, published applications and references cited herein are incorporated by reference in their entirety.

It is proposed a computer-implemented method for simulating the physical behavior of at least one object in a three-dimensional (3D) scene divided into a plurality of zones. The 3D scene may simulate a real-world environment. The 3D scene comprises one or more objects, e.g. 3D modeled objects. The method comprises providing an object located in one or both zones. The method further comprises simulating the physical behaviour of the object. The physical behaviour means how the object interacts in the 3D scene with other objects, if any. The simulation of the physical behavior of the object is performed by the computing resource of each one of said first and second zones. Thus, the computing resource of each zone on which the object is located contribute to the simulation.

Such a method improves the simulation of the physical behavior of the object in the 3D scene, without imposing ad-hoc customization of the 3D scene or restrictions on its characteristics. Indeed, the simulation is taken in charge by the one or more zones on which the object is located so that the crossing from a first zone to a second zone is performed in a continuous way, that is, in a seamless way. As a result, there is no impact on the simulation by one of the zones on which the object is located, and therefore, the physical laws can be continuously applied on the object. The simulation is therefore improved; that is, the simulation is more realistic.

The method is computer-implemented. This means that the steps (or substantially all the steps) of the method are executed by at least one computer or a computerized system. In examples, the triggering of at least some of the steps of the method may be performed through user-computer interaction. The level of user-computer interaction required may depend on the level of automatism foreseen and put in balance with the need to implement the user's wishes. In examples, this level may be user-defined and/or pre-defined.

For instance, the step of providing an object located in one or both zones may be performed upon user selection. The user may carry out the selection via a haptic device such as a keyboard, a mouse, a stylus, or the like. For instance, in a two-button mouse, the left button could be used for selecting the scene in a list of scenes. The system may also identify by default an object and located it on one or more zones of the 3D scene, i.e. the providing and the location are performed without requiring user selection.

A typical example of computer-implementation of the method is to perform the method with a system comprising a memory and a processor. The memory, which stores a database, is merely any hardware suitable for such storage. The processor may also be referred to as a computing unit. Such a system provides a scalable, seamless, and effective real-time simulation of a 3D scene in the context of real-world simulation applications. The system may further comprise a graphical user interface (GUI) suitable for displaying a 3D scene, first and second zones, and one or more objects within the 3D scene. The GUI is coupled with the memory and the processor.

By "database", it is meant any collection of data (i.e. information) organized for search and retrieval. When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

In the case of the method, the database may store a three-dimensional scene divided into a plurality of zones, for instance first and second zones topologically adjacent. The database may further store one or more objects, and they may be stored independently from the scene. The database may further comprise a computer program comprising instructions for execution by the system. The instructions are adapted for performing the steps of the present method.

The method generally manipulates objects. An object is any object defined by data stored in the database. By extension, the expression "object" designates the data itself. According to the type of the system, the objects may be defined by different kinds of data. The system may be any combination of a CAD system, a CAE system, a CAM system, and/or a PLM system. In those different systems, modeled objects are defined by corresponding data. One may accordingly speak of CAD object, PLM object, CAE object, CAM object, CAD data, PLM data, CAM data, CAE data. However, these systems are not exclusive one of the other, as an object may be defined by data corresponding to any combination of these systems. A system may thus well be both a CAD and PLM system, as will be apparent from the definitions of such systems provided below. The system may be also MMO or MMOG system wherein objects are manipulated upon user action.

By CAD system, it is meant any system suitable at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

A CAD system may be history-based. In this case, a modeled object is further defined by data comprising a history of geometrical features. A modeled object may indeed be designed by a physical person (i.e. the designer/user) using standard modeling features (e.g. extrude, revolute, cut, and/or round etc.) and/or standard surfacing features (e.g. sweep, blend, loft, fill, deform, smoothing and/or etc.). Many CAD systems supporting such modeling functions are history-based system. This means that the creation history of design features is typically saved through an acyclic data flow linking the said geometrical features together through input and output links. The history based modeling paradigm is well known since the beginning of the 80's. A modeled object is described by two persistent data representations: history and B-rep (i.e. boundary representation). The B-rep is the result of the computations defined in the history. The shape of the part displayed on the screen of the computer when the modeled object is represented is (a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent.

By PLM system, it is meant any system suitable for the management of a modeled object representing a physical manufactured product. In a PLM system, a modeled object is thus defined by data suitable for the manufacturing of a physical object. These may typically be dimension values and/or tolerance values. For a correct manufacturing of an object, it is indeed better to have such values.

By CAE system, it is meant any system suitable for the analysis of the physical behaviour of a modeled object. In a CAE system, a modeled object is thus defined by data suitable for the analysis of such bahavior. This may be typically a set of behavioring features. For instance, a modeled object corresponding to a door may be defined by data indicating that the door rotates around an axis.

Figure 8:
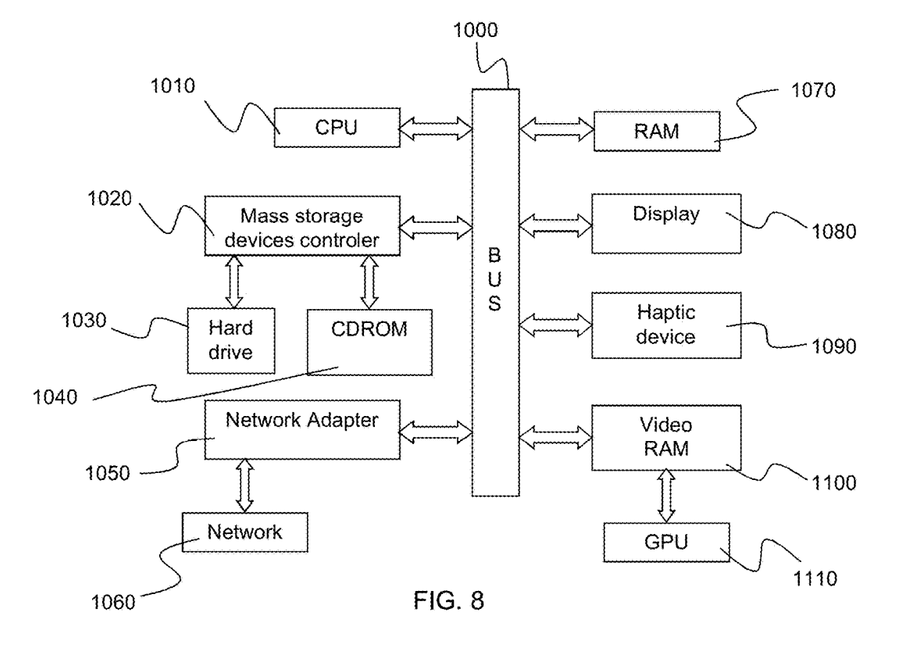
FIG. 8 shows an example of a computerized system.

FIG. 8 shows a client computer system, e.g. a workstation of a user.

The client computer comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals.

A computer program may comprise instructions by a computer, the instructions comprising means for causing the above system to perform the above method. The invention may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output.

The invention may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language.

Figure 1:
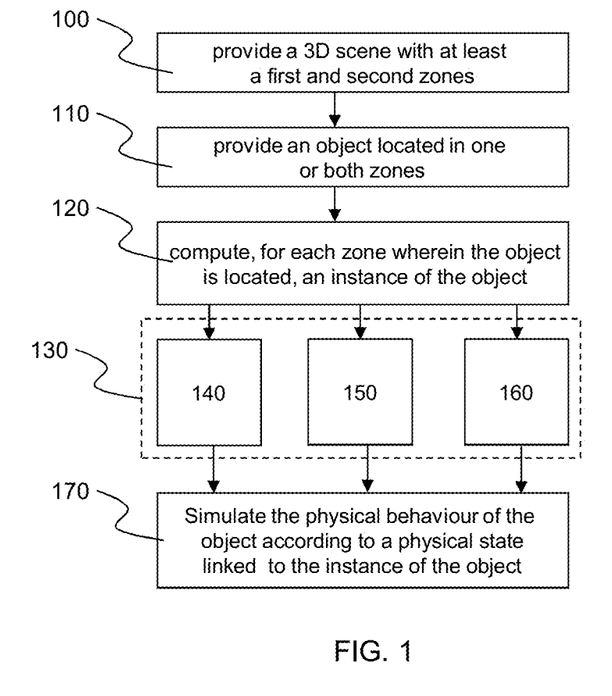
FIG. 1 shows a flowchart of an example of the method.

In reference to the flowchart of FIG. 1, it is now discussed an example of the method simulating the physical behavior of at least one object in a 3D scene divided into a plurality of zones.

At step 100, it is provided at least a first zone and a second zone that are topologically adjacent. In practice, the first and second zones are part of a 3D scene divided into a plurality of zones. The term zone may designate a surface in the 3D scene. The term zone may also designate a volume in the 3D scene. The first and second zones are topologically adjacent so that the complete space of the 3D scene is divided into a plurality of zones, e.g. at least first and second zones. For instance, the volume defined by the 3D scene may be divided into a set of topologically adjacent boxes such as cubes so that the complete volume defined by the 3D scene is comprised in the boxes. As another example, the 3D scene may comprise a ground on which objects moves (e.g. humans, cars), and the ground may be divided into several adjacent polygonal zones.

Each zone of the 3D scene has its own computing resource. In practice, a percentage of the computing power of a Central Processing Unit (CPU) is given to each zone. This percentage may be the same for each zone, or may differ. The computing resource of a zone is typically used for simulating the object located in the zone: indeed, an object generates a computing resource cost, that is, each object requires a time of the computations resources in order to the executed in the zone.

A 3D scene is a space in which spatial relationships between objects (if any) are described. The scene is comprised of at least one object, and the object may be, but is not limited to, a modeled object or 3D modeled object. A 3D modeled object is a description of an object in a 3D space. A 3D scene is a model of a physical universe, which may be mathematically represented by a geometry which describes every point in 3D space by means of coordinates. The 3D scene is typically a real-world simulated wherein realistic interactions between objects are simulated. The expression realistic interactions means that the simulated interactions reflects the interactions of the real-world, e.g. physical laws such that such that forces and efforts (gravity, contact, . . . ), control laws such that information flow, control events, . . . . The one or more objects evolve in the 3D scene and are subject to the laws of the simulated real-world, e.g. two objects cannot intersect each other. The 3D scene may execute a specific scenario, wherein a scenario is a narrative, which most commonly describes foreseeable interactions of objects. Said otherwise, a scenario evaluates the implications of alternative possible worlds or situations; for instance, the analysis of the impact of a new material on a car. It is to be understood that the scenario may be defined by the user.

Next, at step 110, it is provided an object. This amounts to say that an object is selected and loaded in the 3D scene. The selection of the object may be performed by the user, or it may be done by the system performing the present method. The selection is performed as known in the art. Loaded means that the object is available to the system performing the method.

The object is located in one of the first and second zones, or in both first and second zones. The object is located in one zone if no point of the object is out the zone. The object is located in two zones if at least one point of the object is out the first zone and in the second zone. In the event at least one point of the object is located on the common border between two zones, the two zones being topologically adjacent, the object may considered as being located in only one zone or as being located in both zones; this is a convention and it may be configured, e.g. by the user. The point of an object is any point in the 3D scene that is interior or part of the boundary of the object.

Next, at step 120, an instance of the object is computed for each zone wherein the object is located. The instantiation of the object is performed as known in the art. The instantiation may be performed according to parameters set by the user, or automatically set. These parameters of the instantiation may be, but not limited to, the selected complexity of the 3D mesh of the object, the precision of the textures, reflection and shading of the object in the 3D scene, and other physical parameters and properties. It is to be understood that the instantiation of the object may be performed while the provided object is placed in the 3D scene, that is, placed in the first zone and/or second zone.

Thus, at step 120, an instance of the object is computed and located on the same zone on which the object is located, or two instances of the object are computed and one instance is located on each zone on which the object is located.

In the event the object is located on the first and second zones, an instance of the object is computed for each zone, that is, two instances are computed, and the computed instances are identical. The term identical involves that the respective physical state of each one of the instances of the object are identical. This amounts to say that the instances are clones obtained from the provided object at step 110. The physical state of an object is the set of the physical parameter (s) of the object with the 3D scene. The 3D scene is thus a virtual environment. The expression physical parameter(s) and the expression physical properties are identical in both zones. The physical parameter(s) of an object may be, but are not limited to, the position of the object in the 3D scene, the speed of the object in the 3D scene . . . . The physical parameters of an object are typically defined by classical mechanics, as known in the art.

In practice, the physical state of the object may be maintained by the object solver, the solver of the object being a piece of software, such as a computer program or as a software library, that takes problem descriptions and calculate the problem solution. Maintaining the physical state of the object by the object solver is advantageous inasmuch as the solver uses the physical state of object in order to compute the instances. The physical state of an object may be for instance represented by, but not limited to, a vector of data that comprises proper magnitude and unit system according to the simulated physics.

The simulation of the physical behavior of the object may be performed according to the physical state that is linked with the instance of the object. This means that physical parameter(s) of the set of physical parameters of the instance of the object are used for performing the simulation. The simulation of the physical behavior of the object is made from the one or more instances of the object that have an identical physical state. This advantageously allows avoiding any impact of the crossing of a zone so that the physical laws can be applied on the object in a continuous way.

The physical state is linked with the instance of the object means that there is an association or relationship between the physical state and the instance of the object. Typically, this relationship may be handled by the solver associated to the zone containing the instance. Linking the physical state with the object is advantageous because the exchange and the sharing of the physical state between the instances of the object is more easy than if the physical information is stored within the object, e.g. with data of the object. Thus, maintaining the computed instances identical is facilitated. Furthermore, the solvers do not have to be scheduled synchronously, thus avoiding the difficult implementation of a synchronization mechanism.

In practice, information may be exchanged between the first zone and the second zone that include at least the physical state of the object in one zone and the presence or the absence of the object in the other zone. Said otherwise, the information comprises data, and these data at least represent the physical state of the object in the first zone and at least indicate the presence or the absence of the object in the other zone.

The exchange of information between the first zone and the second zone may be performed through an asynchronous communication channel between the first and the second zones. The asynchronous communication channel may comprise an asynchronous transmission that uses start and stop bits to signify the beginning bit. Asynchronous communication channel advantageously avoid synchronization between both communication sides, and it therefore more easy to implements. In particular, the solvers do not have to be scheduled synchronously.

The exchange of information between the first zone and the second zone may also be performed with a reliable communication channel between the first and the second zones. For instance, the communication channel may be defined by the IP protocol and the transport system by the TCP (Transmission Control Protocol) protocol. It is to be understood that the reliability may be provided at any layer of the OSI (Open Systems Interconnection) model. Because zones are computed on same node and synchronized, there are no delay and no data loss, and therefore numerical noise is minimal.

The exchange of information between the first zone and the second zone may also be performed with an unreliable communication channel between the first and the second zones. The delivery of information is said to be unreliable, because delivered information may be lost, duplicated, delayed or delivered out of order without notice to the sender or receiver. For instance, the communication channel may be defined by the IP protocol and the transport system by the UDP (User Datagram Protocol) protocol. The unreliable communication channel may thus use the UDP protocol. It is to be understood that the unreliability may be provided at any layer of the OSI (Open Systems Interconnection) model. Advantageously, using unreliable communication saves bandwidth. Furthermore, occasional message loss results in a local perturbation that can be smoothed by solver, and the local perturbation is therefore almost invisible.

The exchange of information between zones may preferably be done only to the neighbor zones of a zone. In other words, messages can be exchanged only between topologically adjacent zones.

Furthermore, a zone always exchanges information with other zones without expecting any acknowledgement. This is for instance illustrated in the discussion of FIG. 7 below when it is assumed that the exchange of information between two zones is performed with an unreliable communication channel.

Figure 5:
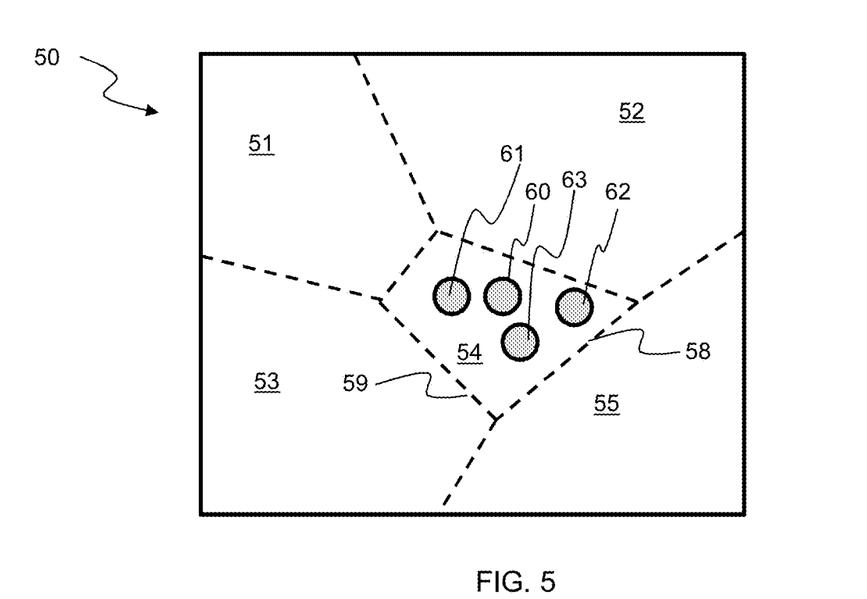
FIG. 5 shows an example of a 3D scene divided into a plurality of zones.

Referring now to FIG. 5, it is illustrated an example of a 3D scene 50 divided into a plurality of topologically adjacent zones 51, 52, 53, 54, 55. The 3D scene represents a virtual world, and the ground of this virtual world is partitioned into the adjacent zones. Each zone is managed by a computing resource, e.g. a part of computing resources provided by a CPU. The computing resource may be continuously performing the real-time solving of the instantaneous physical states of all the objects 60, 61, 62, 63 located in the zone 54, using an appropriate solver. In this example, the physical state of an object 56 may consist of the instantaneous cartesian and angular positions/velocities of this object in the zone 54, so as to render its behavior for instance according to rigid body dynamics. It is to be understood that this can be generalized to other domains of Physics.

Referring back to FIG. 1, at step 130, it is determined where the object is located on the 3D scene. Indeed, the object provided at step 110 may move in the 3D scene, which involves that the location of the object has been modified. Several cases 140, 150, 160 may be contemplated, depending on whether the object has moved and on whether the object has changed of zone.

Figure 6:
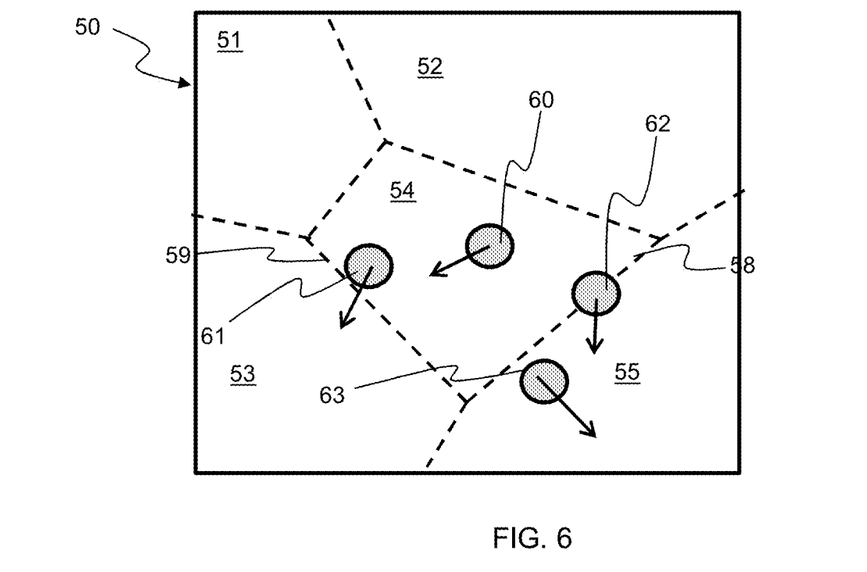
FIG. 6 is another view of the 3D scene of FIG. 5.

Referring now to FIG. 6, it is illustrated another view of the 3D scene of FIG. 5 wherein the objects 60, 61, 62, 63 have moved, and have therefore new locations.

The object 60 is still located in the zone 54. Thus object 60 is said to evolve exclusively in the zone 54. The physical state of the object such as position and velocity is completely determined by the own solver of the object 60. This is the typical situation for common simulations.

The object 61 has one of its points on the border 59. In this example, the object 61 is considered as being localized on the zone 54 only. It is to be understood that it could be considered as being localized on the zones 54 and 53, depending the chosen convention. As for the object 60, the physical state of the object 61 is completely maintained by its solver.

The object 62 has at least one point in the zone 54 and at least one point in the zone 55: it is thus located on both the zones 54 and 55. The object 62 has therefore not completely crossed the border 58 between the topologically adjacent zones 54 and 55; the object may be said as being on the border 58. This situation occurs because the object was initially located completely on a first zone that is referred to as the departure zone (the zone 54), and has entered, as a result of the move, into a second zone, that is referred to as the arrival zone (the zone 55). This situation is illustrated on FIG. 2 depicting the case 140 of FIG. 1.

Figure 2:
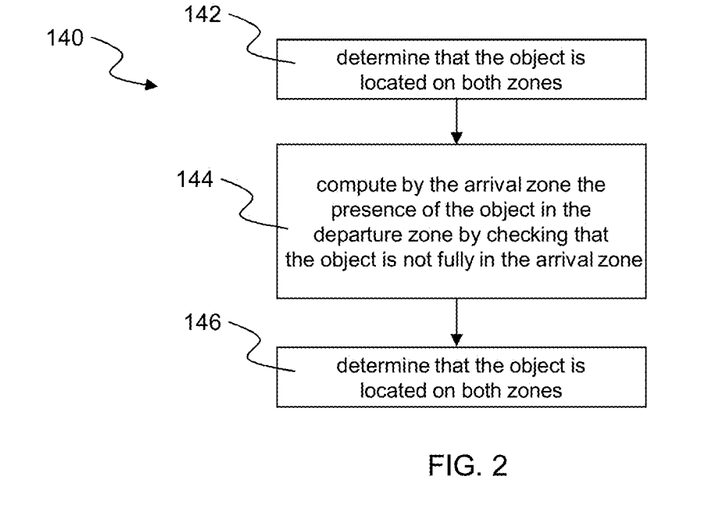
FIGS. 2 to 4 depict examples of steps 140, 150, 160 of FIG. 1.

Referring now to FIG. 2, at step 142, it is determined that the object is located on the first zone and the second zone; that is, the object is on both zones. This is performed by each zone on which the object is located, that is, each zone indicates that the object is located on it.

Next, at step 144, it is computed, by the arrival zone of the object, the presence of the object in the departure zone of the object. It is to be understood that the detection of the object by the arrival zone in the departure may be performed by a dedicated solver associated with the zone. The detection is carried out by checking that the object is not fully in the arrival zone. It is to be understood that the steps 142 and 144 are closely related.

Then, at step 146, information that indicates the presence of the object in the departure zone is exchanged from the arrival zone to the departure zone. Said otherwise, the arrival zone sends one or more messages to the departure zone indicating that the presence of the object has been detected by the arrival zone in the arrival zone. Because the detection is made by the arrival zone, the robustness of the process is improved. This will be apparent in the discussion of description of FIG. 7.

In practice, the creation of the instance may comprise a conciliation of the physical state of the object from the two results delivered by both solvers of each respective first zone and second zone. The conciliation process advantageously allows to obtain two identical instances of the object. The conciliation process may be performed by the solver of each instance of the object. After the conciliation process, both zones should consistently have identical valuations for the physical state of the object they share. It is to be understood that the conciliation may be preferably performed before the instance of the object is created by the arrival zone in the arrival zone.

Referring back to FIG. 6, the object 63, initially completely located on zone 54, has left the zone 54 and is now exclusively located in the zone 55, as a result of a move. Thus, the object left the departure zone 54 and completely entered the arrival zone 55. This situation is illustrated on FIG. 3 depicting the step 150 of FIG. 1.

Figure 3:
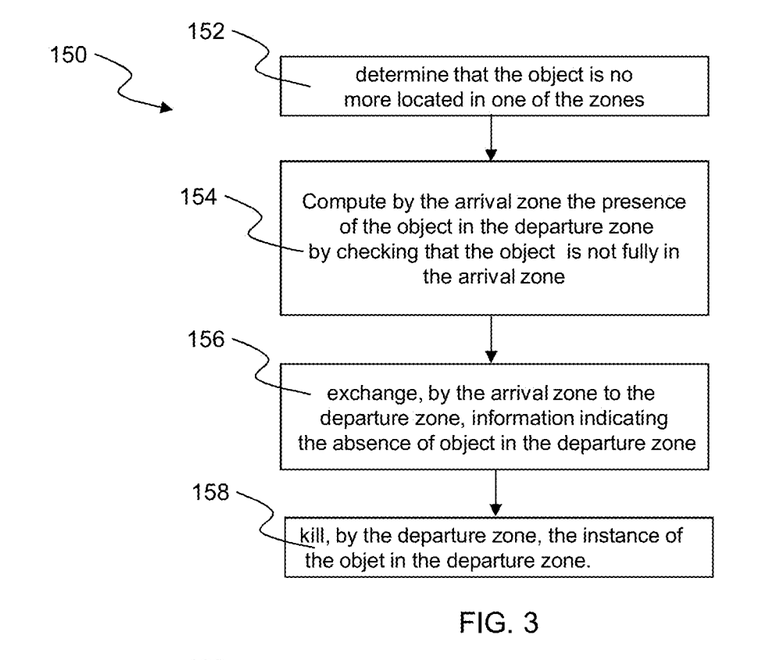

Referring now to FIG. 3, at step 152, it is determined that the object is no more located in the first zone or in the second zone. The determination is performed by each zone on which the object is located.

Next, at step 154, it is computed, by the arrival zone of the object, the absence of the object in the departure zone of the object. It is to be understood that the detection of the object by the arrival zone in the departure may be performed by a dedicated solver associated with the arrival zone. The detection is carried out by checking that the object is fully in the arrival zone. That is, the detection checks that each point of the object is located in the arrival zone.

Then, at step 156, information that indicates the absence of the object in the departure zone is exchanged from the arrival zone to the departure zone. Said otherwise, the arrival zone sends one or more messages to the departure zone indicating that the absence of the object has been detected by the arrival zone in the departure zone.

Next, at step 158, the departure zone kills the instance of the object in the departure zone. Killing an instance means that the instance is suppressed from the zone, here, the departure zone. Hence, the suppression of the instance is made as a result of the one or more messages sent by the arrival zone to the departure zone and indicating the result of the step 154, that is, the arrival zone has computed the absence of the object in the departure zone of the object.

In practice, the suppression of instance may comprise the discarding of corresponding physical state of the instance of the object in the solver. For instance, and now in reference to FIG. 6, the solver of the instance of the object 63 in the arrival zone 54 will discard any message exchanged between the solver of the instance of the object 63 in the zone 54 will discarded after that the arrival zone has computed that the object is absent in the departure zone. This advantageously allows to avoid modifications of the physical state of the instance of an object in the arrival zone based on physical state information of the instance of an object that should not more exist: indeed, the transmission of the message indicating to the departure zone that it can kill its instance of the object may not arrived, or be delayed. The discarding provides therefore a safety mechanism of the physical properties of the instance of the object in the arrival zone. In addition, the discarding allows to relieve solver from calculating useless data.

Referring back to FIG. 6, the object 62, initially completely located on zone 54, has entered the zone 55 and is now located on both the zones 54 and 55. In other words, the object 62 is penetrating in one neighbor zone 55 of the zone 54; the border 58 is being crossed by the object. This situation is illustrated on FIG. 4 depicting the step 160 of FIG. 1.

Figure 4:
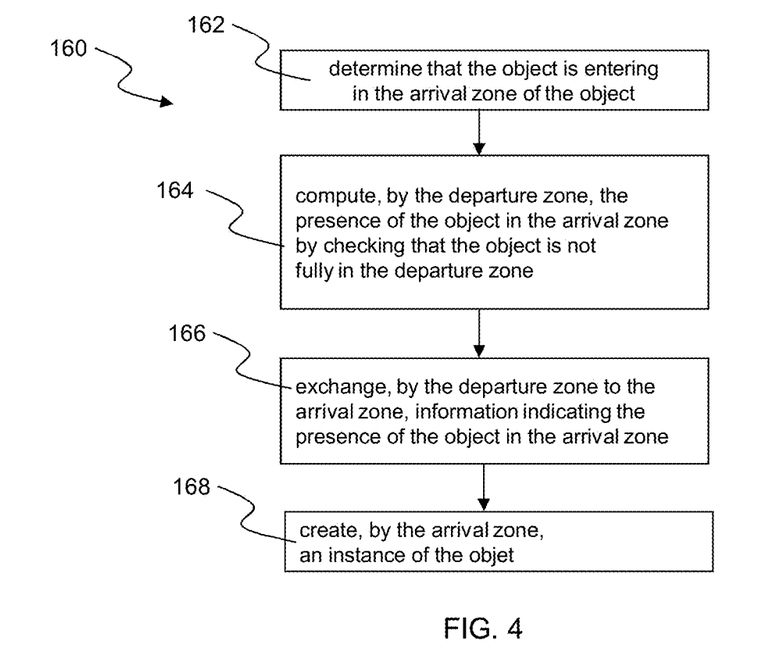

Referring now to FIG. 4, at step 162, it is determined that the object is entering in one of the zone that is the arrival zone of the object. The determination is performed by each zone on which the object is located, that is, each zone indicates that the object is located on it.

Next, at step 164, it is computed by the departure zone, the presence of the object in the arrival zone by checking that the object is not fully in the departure zone. It is to be understood that the detection of the object by the departure zone in the arrival may be performed by a dedicated solver associated with the departure zone. The detection is carried out by checking that at least one point of the object is located in the arrival zone.

Next, at step 166, information that indicates the presence of the object in the arrival zone is exchanged from the departure zone to the arrival zone. Said otherwise, the departure zone sends one or more messages to the arrival zone indicating that the presence of the object has been detected by the departure zone in the arrival zone.

Then, at step 168, the arrival zone creates an instance of the object in similar state as the instance of the object in the departure zone. This amounts to say that a similar instance of the object is computed.

At this step of the process of FIG. 1, for one or more objects of the 3D scene, cases 140, 150, or 160 have been identified.

Next, at step 170, the physical behavior of the object is simulated, that is, the physical behavior of the object is performed according to a physical state linked with the instance of the object. Preferably, the simulation may be performed according to a physical state linked with the instance of the object.

Figure 7:
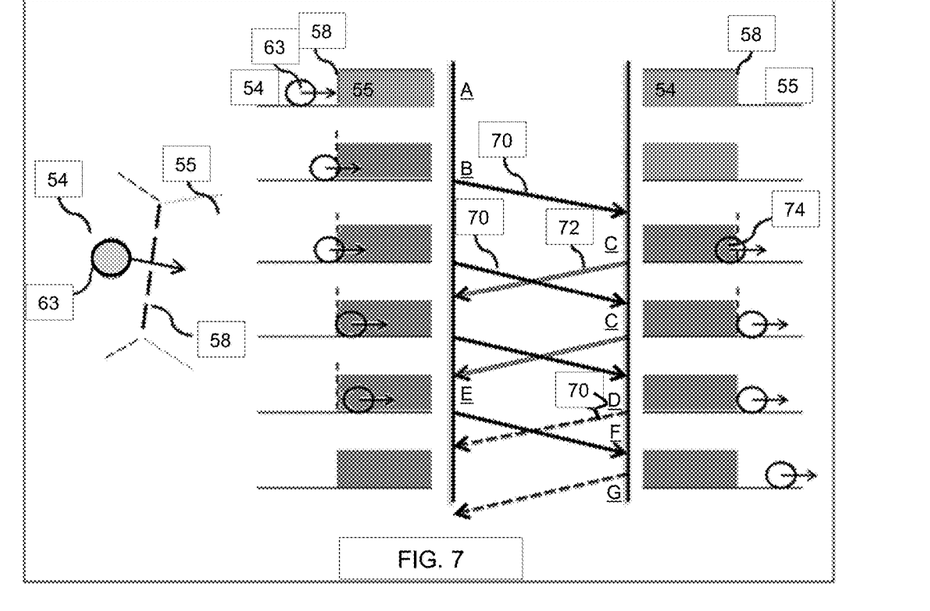
FIG. 7 shows an example of exchanges of information between two zones.

Referring now to FIG. 7, it is shown an example of exchanges of information between two zones 54 and 55 which are also depicted on FIGS. 5 and 6. In the scenario of FIG. 7, the object 63 moves from the departure zone 54 wherein it is located to the arrival zone 55 wherein it is finally completely located. The move from the first to the second zone is depicted in six consecutive sequences (A), (B), (C), (D), (E), (F), and (G). The left part of FIG. 7 shows the position of object 63 as seen by the departure zone 54, while the right part shows the position of the same object as seen by the arrival zone 55. One notices that the object 63 is known as object 74 by the arrival zone 55.

At the sequence (A), the object 63 is only in the zone 54.

Then, at the sequence (B), the zone 54 detects that object 63 is located across the border 58 with its neighbor zone 55. The zone 54 has checked that the object is not fully in the departure zone. The zone 54 exchange that information with the arrival zone and send a message 70 so called Border Message to the zone 55. This message 70 explicitly notifies that the object is across the border. In addition, the exchanged information from the departure zone to the arrival zone further includes the physical state of the object in the departure zone.

Next, at sequence (C), the zone 55 receives the border message 70. Two situations may occur, assuming the message transmission is reliable. These two situations are the following:

(i) either zone 55 does not know the object 63. In this case, the zone 55 creates an instance 74 of the object 63 in the physical state specified within boarder Message 70.

(ii) either zone 55 already knows the object 63 as object 74. In this case, the zone 55 registers the specific physical state information contained within the received border message 70. Concomitantly, the zone 55 detects that the object 74 is located across the border 58 and sends a border message 72 to the zone 54 notifying that the object is across the border (that is, the zone 55 notifies the zone 54 that zone 55 has detected that the object is in the zone 54) and along with the physical state of the instance of the object 74 in the zone 55.

One notices that the zone 54 detects again at the sequence (C) that the object is across the border. It is to be understood that while the object is across the border, both the departure and arrival zones will exchange border messages 70, 72.

Then, at the sequence (D), the zone 55 determines that object 74 is no more located in neighbor zone 54, and still receives border message from zone 54 about this object. The arrival zone 55 sends a Deletion Message 75 to the departure zone 54. This Deletion Message explicitly notifies that the object is no more located in the zone (54).

Next, at the sequence (E), the zone 54 receives Deletion Message 75 and kills the instance of the object 63, when not already destroyed.

Next, at the sequence (F), the object 63 is completely located on the zone 55, that is, there remains only one instance of the object 63 in the zone 55.

Back to the sequence (C), it is now assumed that the exchange of information between the departure zone 54 and the arrival zone 55 is performed with an unreliable communication channel. Occasional loss of messages may thus happen. Noting that the emission of messages between two zones is a repetitive process as long as the object is shared by both zones, a lost message is always followed by another of same kind, but with a more recent state data about the object:

(i) in case of loss of a Border Message 70 about unknown object by arrival zone 55, it means either that zone 55 will instantiate an identical object with additional delay upon reception of next Border Message.

(ii) in case of loss of Border Message 70 about already known object by the arrival zone 55, this zones will miss few useful data for conciliation ring on physical state of the object, thus creating a perturbation. However, this perturbation will be compensated with the reception of the following Border Message. It is to be understood that the situation is similar in the case of a loss of a border Message 72 sent by the arrival zone to the departure.

(iii) in case of loss of Deletion Message 75, the Zone 54 still knows the instance of the object 63 and therefore sends messages to Zone 55 about this object. So, in the next simulation step, Zone 55 will send again a Deletion to Zone 54, which will hopefully delete the Object.

Then at sequence (G), the object 74 is fully in the zone 55 and its physical state only depends on conditions in the zone.

The method according to the invention may be continuously performed by the system implementing the present invention. In particular, the steps performed after the steps of providing at least a first zone and a second zone topologically adjacent, and providing an object located in one or both zones, may be continuously performed.

Thus, messages are continuously exchanged between the zones in order to inform each other about objects entering or leaving a zone. Interestingly, the method may be stopped when it is detected that no object moves in the 3D scene (for instance, no object has been provided in the 3D scene), and restarted when one or more objects move in the 3D scene (for instance, an object has been provided in the 3D scene).

Hence, the robustness of the protocol is granted by the fact that the creation or the deletion of an object in a particular zone is triggered not by the zone itself, but rather by its neighbor zone(s) and by the redundancy in time of messages: may a message be lost, it will be compensated by next of same kind.

The preferred embodiment of the present invention has been described. It will be understood that various modifications may be made without departing from the spirit and scope of the invention. Therefore, other implementations are within the scope of the following claims.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method for simulating real-world physical behavior of at least one three-dimensional (3D) object in a 3D scene divided into a plurality of zones, comprising:
   providing at least a first zone and a second zone topologically adjacent with at least one common border, each zone having its own computing resource;
   providing a three-dimensional (3D) model of an object located in one or both zones;
   detecting that the 3D model of the object is crossing the border;
   in response to detecting that the 3D model of the object is crossing the border, exchanging information from the computing resource of the first zone to the computing resource of the second zone and from the computing resource of the second zone to the computing resource of the first zone, the respective exchanged information from the computing resource of the first zone to the computing resource of the second zone and from the computing resource of the second zone to the computing resource of the first zone both including at least the physical state of the 3D model of the object in one zone and the presence or the absence of the 3D model of the object in the other zone;
   on each computing resource, performing a conciliation of the physical states of the 3D model of the object exchanged from the computing resource of the first zone to the computing resource of the second zone and of the physical state of the 3D model of the object exchanged from the computing resource of the second zone to the computing resource of the first zone; and
   simulating the physical behavior of the object using the 3D model, the simulation being performed by the computing resource of each one of said first and second zones.

2. The computer-implemented method of claim 1, wherein:
   at the step of providing a 3D model of an object, an instance of the 3D model of the object is computed for each zone wherein the 3D model of the object is located, the computed instances of the 3D model of the object being identical; and
   the step of simulating the physical behavior of the object is performed according to a physical state linked with the instance of the 3D model of the object.

3. The computer-implemented method of claim 2, further comprising, after the step of providing, the steps of:
   determining that the 3D model of the object is located on both zones;
   computing, by one computing resource of both zones that is the arrival zone of the 3D model of the object, the presence of the 3D model of the object in the other zone that is the departure zone of the 3D model of the object by checking that the 3D model of the object is not fully in the arrival zone;
   exchanging, from the computing resource of the arrival zone to the computing resource of the departure zone, information indicating the presence of the 3D model of the object in the departure zone.

4. The computer-implemented method of claim 2, further comprising, after the step of providing, the steps of:
   determining that the 3D model of the object is no more located in one of the zones;
   computing by one computing resource of the zones that is the arrival zone of the 3D model of the object, the absence of the 3D model of the object in the other zone that is the departure zone of the 3D model of the object by checking that the 3D model of the object is fully in the arrival zone;
   exchanging, from the computing resource of the arrival zone to the computing resource of the departure zone, information indicating the absence of the 3D model of the object in the departure zone; and
   killing by the computing resource of the departure zone the instance of the 3D model of the object in the departure zone.

5. The computer-implemented method of claim 2, further comprising, after the step of providing, the steps of:
   determining that the 3D model of the object is entering in one of the zones that is the arrival zone of the 3D model of the object;
   computing by the computing resource of the other zone that is the departure zone, the presence of the 3D model of the object in the arrival zone by checking that the 3D model of the object is not fully in the departure zone;
   exchanging, from the computing resource of the departure zone to the computing resource of the arrival zone, information indicating the presence of the 3D model of the object in the arrival zone; and
   creating by the computing resource of the arrival zone an instance of the 3D model of the object.

6. The computer-implemented method of claim 2, wherein the step of exchanging information between the computing resource of the first zone and the computing resource of the second zone is performed through a synchronous communication channel between the computing resources of the first and the second zones.

7. The computer-implemented method of claim 2, wherein the step of exchanging information between the computing resource of the first zone and the computing resource of the second zone is performed through an asynchronous communication channel between the computing resources of the first and the second zones.

8. The computer-implemented method of claim 2, wherein the step of exchanging information between the computing resource of the first zone and the computing resource of the second zone is performed with a reliable communication channel between the computing resources of the first and the second zones.

9. The computer-implemented method of claim 2, wherein the step of exchanging information between the computing resource of the first zone and the computing resource of the second zone is performed with an unreliable communication channel between the computing resources of the first and the second zones.

10. The computer-implemented method of claim 9, wherein the unreliable communication channel uses the user datagram protocol.

11. A non-transitory computer readable storage medium having recorded thereon a computer program for simulating real-world physical behavior of at least one three-dimensional (3D) object in a 3D scene divided into a plurality of zones, the computer program comprising instructions for execution by a computer, the instructions being adapted for performing the steps of:
- providing at least a first zone and a second zone topologically adjacent with at least one common border, each zone having its own computing resource;
- providing a three-dimensional (3D) model of an object located in one or both zones;
- detecting that the 3D model of the object is crossing the border;
- in response to detecting that the 3D model of the object is crossing the border, exchanging information from the computing resource of the first zone to the computing resource of the second zone and from the computing resource of the second zone to the computing resource of the first zone, the respective exchanged information from the computing resource of the first zone to the computing resource of the second zone and from the computing resource of the second zone to the computing resource of the first zone both including at least the physical state of the 3D model of the object in one zone and the presence or the absence of the 3D model of the object in the other zone;
- on each computing resource, performing a conciliation of the physical states of the 3D model of the object exchanged from the computing resource of the first zone to the computing resource of the second zone and of the physical state of the 3D model of the object exchanged from the computing resource of the second zone to the computing resource of the first zone; and
- simulating the physical behavior of the object using the 3D model, the simulation being performed by the computing resource of each one of said first and second zones.

12. A computerized system for simulating real-world physical behavior of at least one three-dimensional (3D) object in a 3D scene divided into a plurality of zones, comprising:
- a storage system for storing at least a first zone and a second zone topologically adjacent of a three-dimensional scene divided into a plurality of zones and for storing three-dimensional (3D) models of objects in one or both zones;
- a processing unit communicatively coupled to the storage system for simulating the physical behavior of an object by performing the steps of:
- providing at least a first zone and a second zone topologically adjacent with at least one common border, each zone having its own computing resource;
- providing a 3D model of the object located in one or both zones;
- detecting that the 3D model of the object is crossing the border;
- in response to detecting that the 3D model of the object is crossing the border, exchanging information from the computing resource of the first zone to the computing resource of the second zone and from the computing resource of the second zone to the computing resource of the first zone, the respective exchanged information from the computing resource of the first zone to the computing resource of the second zone and from the computing resource of the second zone to the computing resource of the first zone both including at least the physical state of the 3D model of the object in one zone and the presence or the absence of the 3D model of the object in the other zone;
- on each computing resource, performing a conciliation of the physical states of the 3D model of the object exchanged from the computing resource of the first zone to the computing resource of the second zone and of the physical state of the 3D model of the object exchanged from the computing resource of the second zone to the computing resource of the first zone; and
- simulating the physical behavior of the object using the 3D model, the simulation being performed by the computing resource of each one of said first and second zones.

* * * * *